United States Patent
Puech

(10) Patent No.: US 6,431,113 B1
(45) Date of Patent: Aug. 13, 2002

(54) PLASMA VACUUM SUBSTRATE TREATMENT PROCESS AND SYSTEM

(75) Inventor: Michel Puech, Metz Tessy (FR)

(73) Assignee: Alcatel, Paris (FR)

(*) Notice: Subject to any disclaimer, the term of this patent is extended or adjusted under 35 U.S.C. 154(b) by 170 days.

(21) Appl. No.: 09/634,988

(22) Filed: Aug. 8, 2000

(30) Foreign Application Priority Data

Aug. 26, 1999 (FR) .............................. 99 10799

(51) Int. Cl.⁷ ...................... C23C 16/507; C23C 16/505
(52) U.S. Cl. ............................... 118/723 I; 118/723 IR; 156/345.1
(58) Field of Search .................. 118/723 E, 723 I, 118/723, 715, 723 MW, 723 IR, 728; 156/345.1

(56) References Cited

U.S. PATENT DOCUMENTS

| | | | |
|---|---|---|---|
| 4,500,408 A | * 2/1985 | Boys et al. | 204/298.03 |
| 4,579,623 A | 4/1986 | Suzuki et al. | 438/7 |
| 5,855,685 A | * 1/1999 | Tobe et al. | 118/723 I |
| 2001/0015344 A1 | * 8/2001 | Rossman | 216/67 |
| 2001/0018127 A1 | * 8/2001 | David et al. | 428/404 |
| 2001/0020516 A1 | * 9/2001 | Khan et al. | 156/345 |

FOREIGN PATENT DOCUMENTS

| | | | |
|---|---|---|---|
| EP | 0 363 982 A2 | 4/1990 | |
| EP | 0 651 432 A1 | 5/1995 | |
| EP | 0 837 155 A1 | 4/1998 | |
| JP | 62-253786 | * 11/1987 | C23F/4/00 |
| JP | 01 146 327 A | 6/1989 | |
| JP | 411080965 | * 3/1999 | C23C/16/56 |

* cited by examiner

Primary Examiner—Gregory Mills
Assistant Examiner—Rudy Zervigon
(74) Attorney, Agent, or Firm—Sughrue Mion, PLLC

(57) ABSTRACT

In a process for treatment of a substrate placed in a vacuum enclosure, the invention provides for compensating any variation of the active gas supply flowrate through an active gas supply pipe by injecting a complementary flowrate of control gas into an area near controlled gas aspiration means. This circumvents the inability of pressure control systems and impedance matching systems to respond in times of the order of one second to variations of the input active gas flowrate.

12 Claims, 3 Drawing Sheets

PLASMA VACUUM SUBSTRATE TREATMENT PROCESS AND SYSTEM

The present invention relates to plasma vacuum treatment (etching or deposition) of a substrate.

BACKGROUND OF THE INVENTION

Plasma vacuum substrate treatment processes are already known in the art, such as the etching process described in document WO 94/14187, in which the substrate is placed in a vacuum enclosure containing active gases injected in particular via controlled active gas injection means and evacuated via controlled gas aspiration means. The active gases are ionized by plasma-generating means. The substrate in the vacuum enclosure receives bombardment electrical energy generated by a controlled bombardment generator to which it is connected.

During an etching step, ions of a reactive material such as sulfur hexafluoride, generated by ionization, are accelerated by the bombardment energy and impinge on the substrate, for example a silicon-based substrate, in areas that are not covered by a mask. The active ions combine with the material of the substrate to form a gaseous substance that is evacuated by the gas aspiration means.

One problem is to obtain etching with well-defined outlines, i.e. in which the cavities have side walls that are as regular as possible and perpendicular to the surface of the substrate.

To this end, document WO 94/14187 teaches that etching should be carried out by means of an alternating succession of etching steps and protection layer generating steps. During a protection layer generating step, the vacuum enclosure contains an active gas of a first type, such as trifluoromethane ($CHF_3$), which produces a polymerized layer over all of the surface of the substrate, including the bottom and side faces of the cavity. During an etching step the vacuum enclosure contains an active gas of a second type, such as sulfur hexafluoride, which produces ions which are accelerated towards the substrate to produce directional bombardment that impinges selectively on the bottom of the cavities to remove the material of the substrate selectively from the bottom of the cavities without attacking the side faces.

However, it is clear that the etching step lowers the bottom of the cavity relative to the bottom edge of the lateral polymerized protection layer, with the result that an area appears at the bottom of the side face that is not protected by a layer of polymerized material. The active ion bombardment tends to undercut the cavity at the bottom and widen it, affecting the regularity of the side face of the cavity.

To avoid this phenomenon, it is necessary to use a fast alternation of short etching and protection layer generating steps.

Another problem is to optimize performance in terms of etching and protection layer generation.

In most plasma vacuum treatment processes (etching or deposition), the main parameters that can be altered to optimize etching or deposition performance are: the flowrates of the various gases, the working pressure, the electromagnetic power coupled to the plasma to generate it, and the energy with which the substrate is bombarded.

Like the rate of deposition or etching, the selectivity relative to the mask, the regularity of the etching profiles, and the conformity of the deposited layers, etching or deposition performance depends on the conditions of the gaseous phase discharge in terms of the power coupled to the plasma, working pressure and substrate bombardment energy.

As a general rule, to optimize a deposition or etching process, the flowrates of the various gases, the electromagnetic power coupled to the plasma and the substrate bombardment energy are optimized at precise and constant values throughout the treatment.

For example, if patterns are to be plasma etched into a silicon wafer, the active gas flowrates are set at well-defined and constant values, the electromagnetic power coupled to the plasma to a precise value, and likewise the value of the working pressure and the bias voltage, which determine the energy with which the substrate is bombarded by the ions. The above values are held constant throughout the treatment step. In particular, the gas flowrates are set to a precise value and the pressure is maintained at a predetermined value using a pressure regulator system. The pressure regulator system is generally a pump system including at least one pump downstream of a regulator valve slaved to the working pressure, thereby constituting controlled gas aspiration means. Accordingly, regardless of the gas flowrates required, the pressure regulator valve is set so that it procures the required working pressure in the reaction chamber.

The above controlled gas aspiration means operate correctly to regulate the pressure in the event of slow variations in the gas flowrates. However, it is apparent that they cannot efficiently track fast variations in the gas flowrates, such as the variations that can occur if it is required to optimize not only the etching steps but also the protection layer generation steps in an etching process according to document WO 94/14187 by alternating the etching and protection layer generation steps at a sufficiently high frequency to attain sufficiently regular lateral cavity faces. For example, it may be beneficial for the alternating phases to include etching phases with a duration of approximately three seconds and protection layer generation phases with a duration of approximately one second. If the gas flowrate during the etching step is different from the gas flowrate during the protection layer generation step, the mechanical inertia of the controlled regulation valve is unable to track variations this fast.

Nor does the mechanical inertia of the controlled regulator valve allow rapid setting of the gas pressure to two successive different values to optimize two successive short treatment steps.

Another problem is that if the gas pressure inside the vacuum enclosure varies between two successive steps, this produces a variation in the impedance of the plasma as seen by the controlled bombardment energy generator connected to the substrate, and it is then no longer possible to control the bombardment energy efficiently to assure the regularity of the treatment.

The controlled bombardment energy generator is generally associated with an impedance adapter for matching the impedance of the energy source to that of the plasma. The impedance adapter can track slow variations in the impedance of the plasma, for which purpose it comprises a variable capacitor whose capacitance is varied by mechanically moving the capacitor plates relative to each other. However, a device of the above kind is not able to track fast impedance variations, i.e. variations occurring at a frequency in the order of 1 Hz.

OBJECTS AND SUMMARY OF THE INVENTION

The problem addressed by the present invention is therefore that of devising a process and a system in which the flow of active gas in the vacuum enclosure can be varied quickly for vacuum treatment of a substrate without interfering with the means for controlling and regulating ionic bombardment of the substrate.

Another object of the invention is to provide means for obtaining a controlled pressure in the vacuum enclosure using conventional controlled gas aspiration means employing pressure regulator valves but allowing the active gas flowrates to be varied quickly.

To achieve the above and other objects, in a plasma vacuum substrate treatment process of the invention the substrate is placed in a vacuum enclosure containing active gases injected via controlled active gas injection means and evacuated via controlled gas aspiration means, the active gases are ionized by plasma-generating means, and the substrate receives electrical bombardment energy generated by a controlled bombardment energy generator; the process includes at least one sequence of variation of the flow of injected active gas at a rate of variation greater than the capacity to regulate the gas pressure in the vacuum enclosure of the controlled gas aspiration means; the impedance of the plasma as seen by the controlled bombardment energy generator is maintained at a substantially constant level by auxiliary compensation means during the active gas injection flow variation sequence.

In an advantageous embodiment of the invention the impedance of the plasma as seen by the controlled bombardment energy generator is maintained substantially constant by controlled injection of at least one passive control gas into the vacuum enclosure to maintain substantially constant the total flow of gas injected into the vacuum enclosure.

The passive control gas is preferably injected into the vacuum enclosure in an area close to the control gas aspiration means in order to prevent it being ionized.

In a first application, the process includes a succession of steps of injecting active gas at a first injection flowrate and steps of injecting active gas at a second injection flowrate different from the first injection flowrate, at least some of the steps being shorter than the reaction time of the controlled gas aspiration means.

The bombardment power communicated to the substrate can differ from one step to another.

The process can be applied to etching a substrate, for example a silicon-based substrate. In this case, a succession of alternating short steps is advantageously used comprising an etching step in which the first active gas is $SF_6$ during a first time period at a first flowrate and a protection layer generating step during which the second active gas is $C_4F_8$ during a second time period at a second flowrate with simultaneous injection of a complementary flowrate of a passive control gas such as nitrogen or argon.

The process can instead be applied to depositing a deposit on the substrate.

A plasma vacuum substrate treatment system of the invention for implementing a process of the above kind comprises:
  a vacuum enclosure,
  controlled active gas injection means for injecting gas into the vacuum enclosure,
  controlled gas aspiration means for aspirating gas out of the vacuum enclosure,
  plasma-generating means in the vacuum enclosure,
  substrate support means for supporting the substrate in the vacuum enclosure,
  a controlled bombardment energy generator adapted to communicate to the substrate placed on the substrate support means an appropriate level of bombardment energy, and
  auxiliary compensation means for maintaining substantially constant the impedance of the plasma as seen by the controlled bombardment energy generator in the event of variation of the gas entry flowrate and for maintaining substantially constant the gas aspiration flowrate.

In an advantageous embodiment the auxiliary compensation means include means for controlled injection of at least one passive control gas into the vacuum enclosure.

The controlled control gas injection means are preferably adapted to inject the passive control gas into an area of the vacuum enclosure near the controlled gas aspiration means.

The system advantageously includes control means for controlling the controlled control gas injection means to maintain substantially constant the total flow of gas injected into the vacuum enclosure.

BRIEF DESCRIPTION OF THE DRAWINGS

Other objects, features and advantages of the present invention emerge from the following description of particular embodiments of the invention, which description is given with reference to the accompanying diagrammatic drawings, in which.

MORE DETAILED DESCRIPTION

Figure 1:
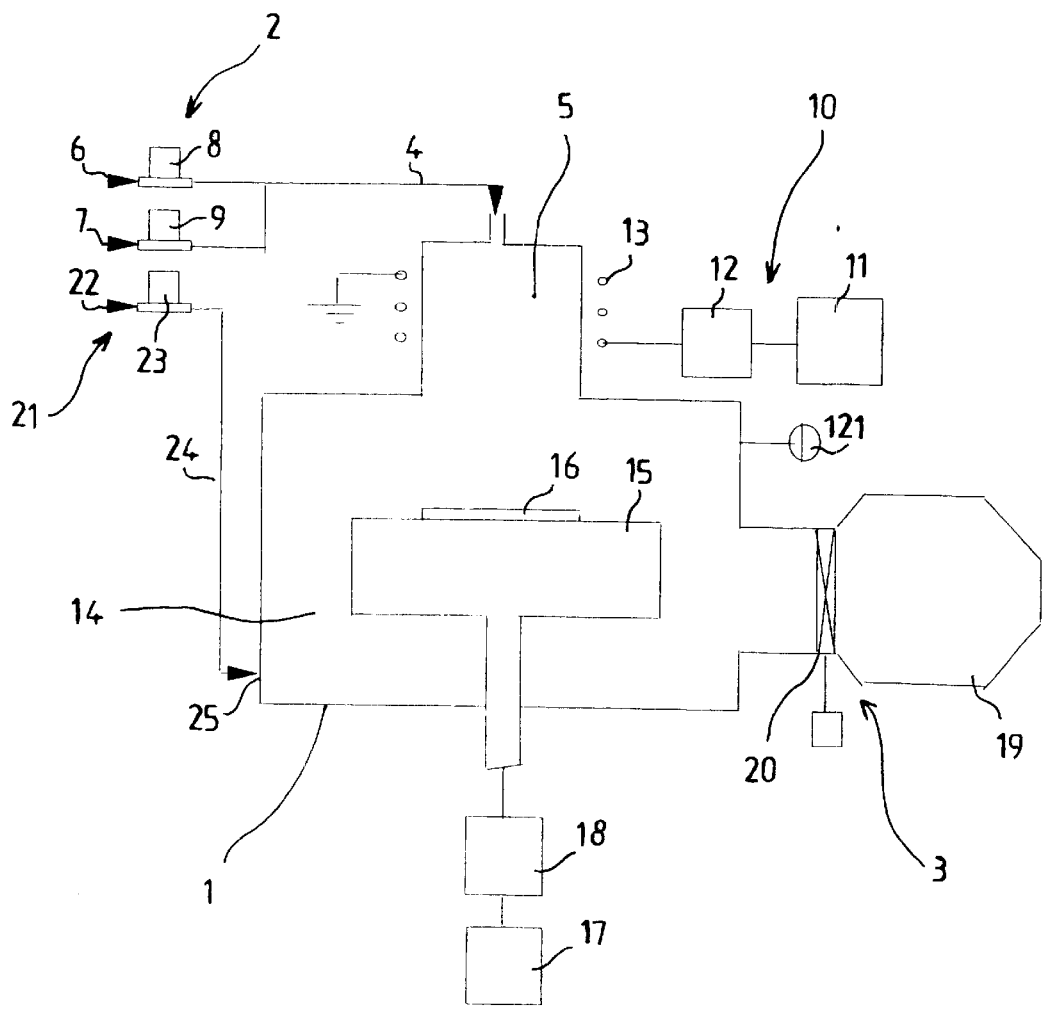
FIG. 1 shows a first embodiment of a plasma vacuum substrate treatment system of the present invention.

In the embodiment shown in FIG. 1, the plasma vacuum substrate treatment system includes a vacuum enclosure 1 with controlled active gas injection means 2 for injecting gas into the vacuum enclosure 1 and controlled gas aspiration means 3 for aspirating gas out of the vacuum enclosure 1.

The controlled active gas injection means 2 include an active gas supply pipe 4 connected to the top part 5 of the vacuum enclosure 1 and receiving a first active gas G1 from a first active gas supply 6 and a second active gas G2 from a second active gas supply 7, each active gas supply being associated with a respective flowmeter 8, 9.

The top part 5 of the vacuum enclosure 1 also includes plasma generating means 10 including a high-frequency excitation generator 11 connected via an excitation impedance adapter 12 to an excitation winding 13. The plasma generating means 10 ionize the gases in the top part of the vacuum enclosure 1 to form a plasma.

A substrate support 15 in the bottom part 14 of the vacuum enclosure 1 supports a substrate 16 to be treated. The substrate 16 faces towards the top part 5 containing the plasma. The substrate support 15 is electrically connected to a controlled bombardment energy generator 17 via a bombardment impedance adapter 18.

The controlled gas aspiration means 3 include gas pumping means 19 whose aspiration inlet is connected to the bottom part 14 of the vacuum enclosure 1 via a pressure-controlled valve 20. The pressure-controlled valve 20 is controlled by a control device, not shown, receiving information from a pressure gauge 121 adapted to sense the pressure inside the vacuum enclosure 1.

The system of the invention further includes auxiliary compensation means for maintaining the impedance of the plasma as seen by the controlled bombardment energy generator 17 constant in the event of variations in the entry flowrate of the gases fed via the active gas supply pipe 4 and for maintaining a substantially constant flowrate of the gas aspirated through the pressure-controlled valve 20.

In the embodiment shown, the auxiliary compensation means include controlled control gas injection means 21. The controlled control gas injection means 21 include a control gas supply 22, a control flowmeter 23 and an auxiliary pipe 24 for injecting a control gas G3 into an area 25 of the vacuum enclosure near the controlled gas aspiration means 3, for example.

The flowmeters 8, 9 and 23 respectively monitor the input flowrates of the active gases G1 and G2 and the control gas G3 and to this end are controlled by control means which are not shown in the figure.

According to the invention, the control means are preferably adapted to control the control gas injection means, i.e. the flowmeter 23, so as to maintain at a substantially constant level the total flow of gas injected into the vacuum enclosure 1 in the event of variations in the flowrate of the active gases entering via the active gas supply pipe 4.

Figure 2:
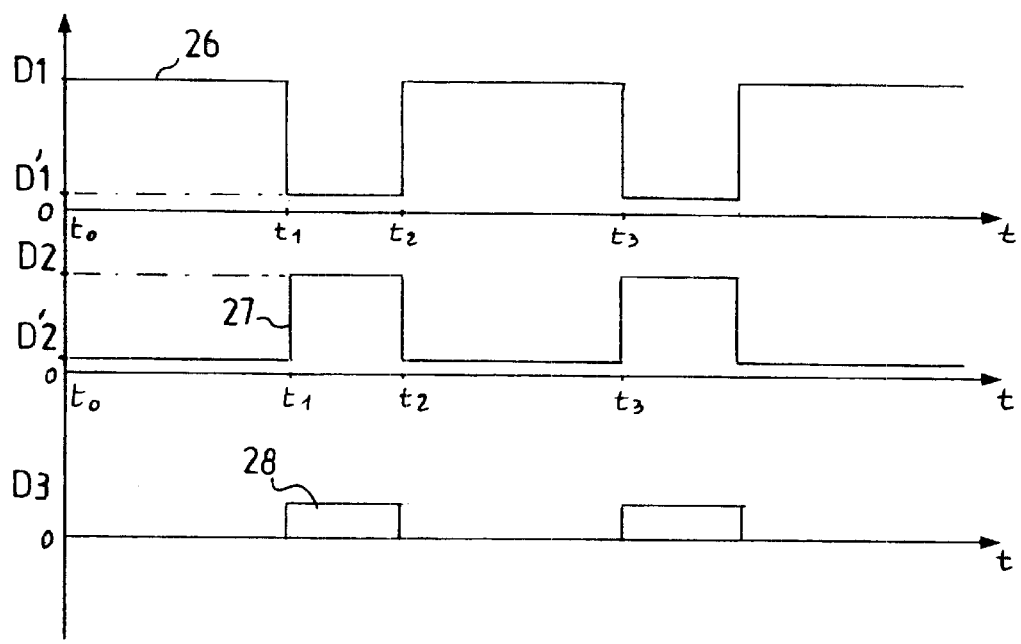
FIG. 2 shows a timing diagram showing the variations in the flowrate of the various gases fed into the vacuum chamber in one embodiment of a plasma vacuum substrate treatment process of the invention.

FIG. 2 shows one example of regulation in accordance with the invention: the curve 26 is a timing diagram of the flowrate D1 of a first active gas G1 in the active gas supply pipe 4 and comprises in succession a constant maximum flowrate step D1, for example from time t0 to time t1, followed by a minimum flowrate step D'1, possibly a zero flowrate step, from time t1 to time t2, then a maximum flowrate step D1 from time t2 to time t3, etc. The curve 27 is a timing diagram of the flowrate D2 of a second active gas G2 and in the diagram the flowrate is at a minimum D'2, which can be zero, between times t0 and t1 and at maximum equal to D2 between times t1 and t2. It is then again at a minimum D'2 between times t2 and t3, etc.

The step between times t0 and t1 can correspond to an etching step, for example, and the step between times t1 and t2 can correspond to a protection layer generation step, for example.

Note that the flowrate D2 D'1 between times t1 and t2 is less than the flowrate D1+D'2 between times t0 and t1. Consequently, the total active gas flowrate takes a value greater than D1+D'2 between times t0 and t1 and a value less than D2+D'1 between times t1 and t2.

According to the invention, between times t1 and t2, a passive control gas G3 is injected at a flowrate D3 substantially equal to (D1+D'2)−(D2+D'1), as shown by the curve 28, via the controlled control gas injection means 21.

Because of the complementary passive control gas G3, the total gas flowrate entering the vacuum enclosure 1 is maintained substantially constant, regardless of the flowrate of the alternating active gases G1 and G2 employed. As a result, the gas pressure inside the vacuum enclosure 1 is substantially constant and the impedance of the plasma is likewise substantially constant. The bombardment impedance adapter 18 therefore operates correctly and transmits a controlled bombardment energy to the substrate 16 and the pressure-controlled valve 20 operates correctly for slow control of pressure inside the vacuum enclosure 1.

By feeding the passive control gas G3 into the area 25 of the vacuum enclosure 1 near the controlled gas aspiration means 3, the control gas is prevented from being ionized in the plasma and therefore contributes to some degree to the results of the current treatment of the substrate 16.

Thus the invention overcomes the inability of pressure control and impedance matching systems as used in plasma vacuum deposition or etching systems to respond to active gas flowrate variations within a time period in the order of one second.

Consequently and as shown in FIG. 1, the system of the invention can be used to choose different gas flowrates G1 and G2 during successive treatment steps, to optimize each step.

In a plasma vacuum substrate treatment process of the invention, the overall active gas injection flow changes suddenly at certain times at least, and at a rate greater than the capacity of the controlled gas aspiration means 3 to regulate the gas pressure in the vacuum enclosure 1. Such active gas injection flow variations occur at times t1, t2 or t3 in FIG. 2, for example. The auxiliary compensation means consisting of the controlled control gas injector means 21 maintain substantially constant the impedance of the plasma as seen by the controlled bombardment energy generator 17 and its bombardment impedance adapter 18.

The impedance of the plasma as seen by the controlled bombardment energy generator 17 is maintained substantially constant by controlled injection of at least one passive control gas G3 into the vacuum enclosure 1 to maintain a substantially constant gas pressure inside the vacuum enclosure 1.

One application of the process of the invention lies in etching the substrate 16, for example. For etching a silicon-based substrate 16 it is possible to use a succession of short steps comprising, alternately, an etching step in which the first active gas G1 is sulfur hexafluoride $SF_6$ at a first flowrate D1 during a first time period T1=t1=t0 and a protection layer generation step in which the second active gas G2 is $C_4F_8$ at a second flowrate D2 during a second time period T2=t2−t1, with injection of a complementary flowrate D3=D1−D2 of a passive control gas G3 such as nitrogen or argon. For example, D1=300 Sccm of $SF_6$ for 3 seconds and D2=200 Sccm of $C_4F_8$ for one second. D3=100 Sccm, simultaneously with the flowrate D2.

Naturally, in the invention, and depending on the nature of the substrate to be treated and the type of treatment, other active gases, other passive gases and other duration and gas flowrate parameters can be chosen.

Thanks to the rapid adaptability of the system according to the present invention, it is possible to alternate quickly successive treatment steps in which the active gas flowrates are different. It is also possible to vary quickly the flowrate of the same active gas.

The invention applies equally to etching and to deposition.

Figure 3:
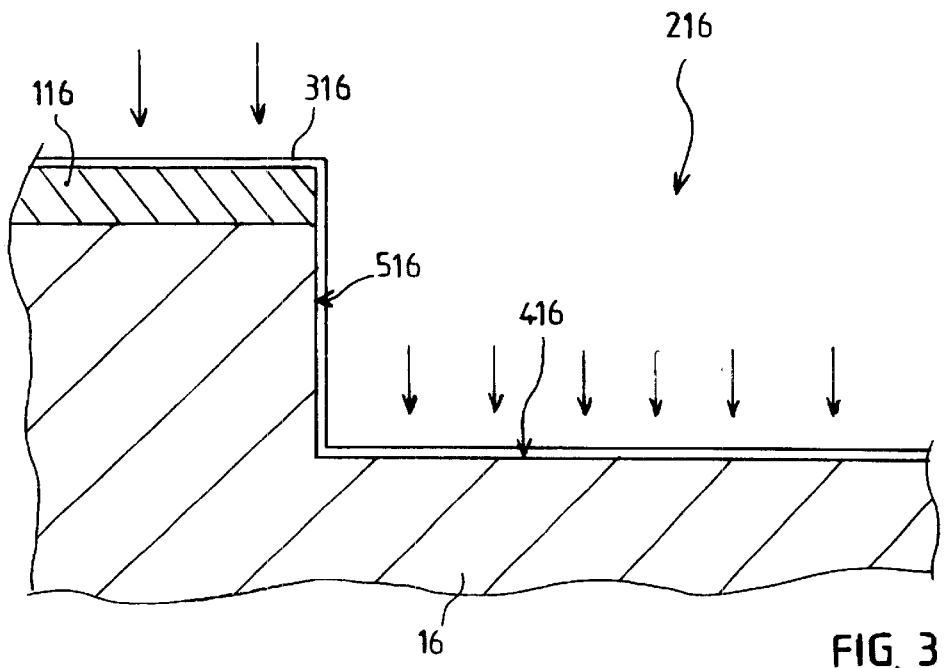
FIGS. 3 and 4 are lateral sections of a substrate illustrating application of a process of the invention to etching the substrate.
Figure 4:
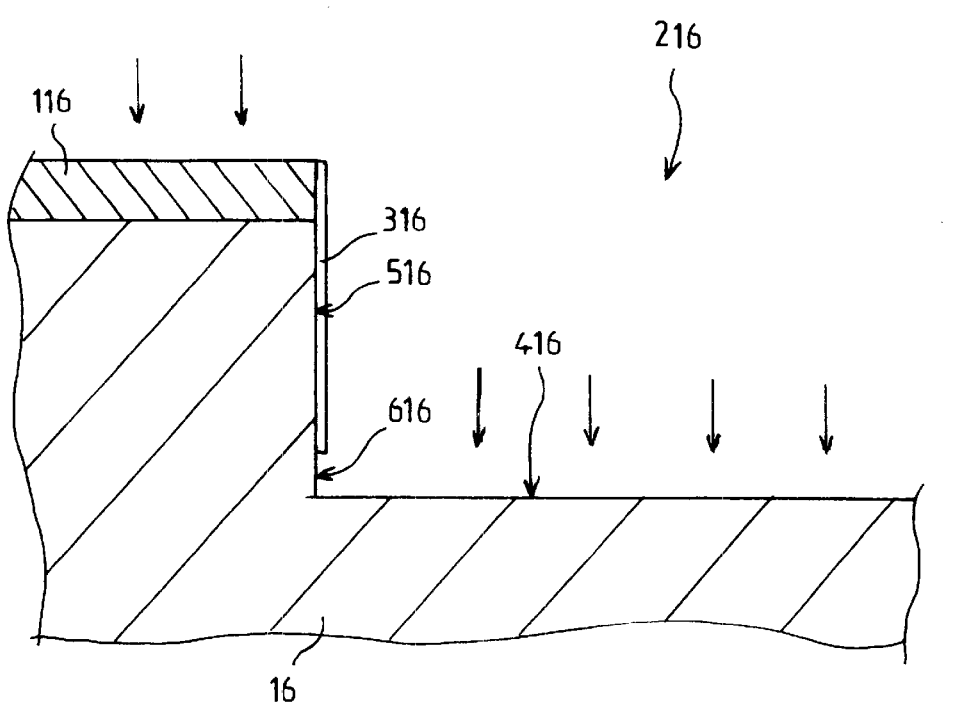

FIGS. 3 and 4 show one application of the process according to the invention to etching.

FIG. 3 shows the step of generating a protection layer: the substrate 16, partly covered by the mask 116, already incorporates a cavity 216 in an area that is not covered by the mask 116. During the step of generating the protection layer, the passivating gas generates a protection layer 316 over all of the top surface, not just the horizontal surfaces, including over the bottom 416 and the side face 516 of the cavity 216.

During the etching step shown in FIG. 4, directional ion bombardment in the direction towards the bottom 416 of the cavity 216 progressively lowers the bottom 416. The protection layer 316 is still present on the side face 516. However, as a result of the lowering of the level of the bottom 416, a bottom portion 616 of the side face 516 is deprived of the protection layer 316. This is why it is necessary to alternate short etching steps (FIG. 4) and short protection layer generation steps (FIG. 3) and therefore to operate at a sufficiently high frequency, for example a frequency of the order of 1 Hz.

The present invention is not limited to the embodiments explicitly described but includes variants and generalizations thereof that will be evident to the skilled person.

What is claimed is:

1. A plasma vacuum substrate treatment process in which the substrate is placed in a vacuum enclosure containing active gases injected via controlled active gas injection means and evacuated via controlled gas aspiration means, the active gases are ionized by plasma-generating means, and the substrate receives electrical bombardment energy generated by a controlled bombardment energy generator, wherein:

the process includes at least one sequence of variation of the flow of injected active gas at a rate of variation greater than the capacity to regulate the gas pressure in the vacuum enclosure of the controlled gas aspiration means, and the impedance of the plasma as seen by the controlled bombardment energy generator is maintained substantially constant by auxiliary compensation means during the active gas injection flow variation sequence.

2. A process according to claim 1, wherein the impedance of the plasma as seen by the controlled bombardment energy generator is maintained substantially constant by controlled injection of at least one passive control gas into the vacuum enclosure to maintain substantially constant the total flow of gas injected into the vacuum enclosure.

3. A process according to claim 2, wherein the passive control gas is injected into the vacuum enclosure in an area close to the controlled gas aspiration means in order to prevent it being ionized.

4. A process according to claim 1, including a succession of steps of injecting active gas at a first injection flowrate D1 and steps of injecting active gas at a second injection flowrate D2 different from the first injection flowrate D1, at least some of the steps being shorter than the reaction time of the controlled gas aspiration means.

5. A process according to claim 4, wherein the bombardment power communicated to the substrate differs from one step to another.

6. A process according to claim 2, the process being applied to etching the substrate.

7. A process according to claim 6, wherein, for etching a silicon-based substrate, a succession of alternating short steps is used comprising an etching step in which the first active gas is $SF_6$, at a first flowrate D1 during a first time period and a protection layer generating step during which the second active gas is $C_4F_8$ at a second flowrate D2 during a second time period with simultaneous injection of a complementary flowrate D3=D1−D2 of a passive control gas such as nitrogen or argon.

8. A process according to claim 1, the process being applied to depositing a deposit on the substrate.

9. A plasma vacuum substrate treatment system comprising:

a vacuum enclosure, controlled active gas injection means for injecting gas into the vacuum enclosure, controlled gas aspiration means for aspirating gas out of the vacuum enclosure, plasma-generating means in the vacuum enclosure, substrate support means for supporting the substrate in the vacuum enclosure, and a controlled bombardment energy generator adapted to communicate to the substrate placed on the substrate support means an appropriate level of bombardment energy, the system further including auxiliary compensation means for maintaining substantially constant the impedance of the plasma as seen by the controlled bombardment energy generator in the event of variations in the gas entry flowrate and for maintaining substantially constant the gas aspiration flowrate.

10. A system according to claim 9, wherein the auxiliary compensation means include means for controlled injection of at least one passive control gas into the vacuum enclosure.

11. A system according to claim 10, wherein the controlled control gas injection means are adapted to inject the passive control gas into an area of the vacuum enclosure near the controlled gas aspiration means.

12. A system according to claim 9, including control means for controlling the controlled control gas injection means to maintain substantially constant the total flow of gas injected into the vacuum enclosure.

* * * * *